(12) United States Patent
Aapro et al.

(10) Patent No.: US 7,486,517 B2
(45) Date of Patent: Feb. 3, 2009

(54) HAND-HELD PORTABLE ELECTRONIC DEVICE HAVING A HEAT SPREADER

(75) Inventors: Teppo Aapro, Vantaa (FI); Harri Lasarov, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/642,571

(22) Filed: Dec. 20, 2006

(65) Prior Publication Data

US 2008/0151503 A1 Jun. 26, 2008

(51) Int. Cl.
*H05K 7/20* (2006.01)
*H01L 23/36* (2006.01)

(52) U.S. Cl. .............. 361/714; 361/705; 361/679; 361/688; 165/80.3; 165/104.33; 165/185; 174/50; 312/223.2; 312/223.3

(58) Field of Classification Search ......... 361/687–689, 361/702–709, 712–719, 753, 756, 758, 788, 361/801, 802, 816, 818, 825, 831; 174/35 R, 174/35 MS, 35 GC, 50, 50.2; 165/80.3, 104.33, 165/185; 455/90.3, 575.1, 575.3, 575.8
See application file for complete search history.

(56) References Cited

U.S. PATENT DOCUMENTS

| | | | | |
|---|---|---|---|---|
| 5,642,261 A | | 6/1997 | Bond et al. ............... 361/704 |
| 5,925,847 A | * | 7/1999 | Rademacher et al. ....... 174/372 |
| 5,991,155 A | * | 11/1999 | Kobayashi et al. .......... 361/705 |
| 6,359,341 B1 | | 3/2002 | Huang et al. ............... 257/778 |
| 6,437,984 B1 | | 8/2002 | Chiu et al. ................. 361/704 |
| 6,965,071 B2 | * | 11/2005 | Watchko et al. ............ 174/377 |
| 6,996,425 B2 | * | 2/2006 | Watanabe ................. 455/575.1 |
| 7,161,809 B2 | * | 1/2007 | Ford et al. ................ 361/719 |
| 7,236,353 B2 | * | 6/2007 | Davidson et al. ........... 361/679 |
| 2002/0080584 A1 | | 6/2002 | Prasher et al. ............. 361/702 |
| 2003/0210533 A1 | | 11/2003 | Baek et al. ................ 361/760 |
| 2004/0061212 A1 | | 4/2004 | Karnezos .................. 257/686 |
| 2004/0150098 A1 | | 8/2004 | Lee ......................... 257/706 |
| 2004/0212056 A1 | | 10/2004 | Chen et al. ................ 257/678 |
| 2004/0264139 A1 | | 12/2004 | Hashizume et al. ......... 361/715 |
| 2005/0142317 A1 | | 6/2005 | Clovesko et al. .......... 428/40.1 |
| 2005/0258534 A1 | | 11/2005 | Hanawa et al. ............ 257/713 |
| 2007/0263352 A1 | * | 11/2007 | Jones et al. ............... 361/688 |

FOREIGN PATENT DOCUMENTS

| | | | |
|---|---|---|---|
| JP | 2002344179 A | * | 11/2002 |
| JP | 2004-260051 | | 9/2004 |
| JP | 2007250725 A | * | 9/2007 |

* cited by examiner

*Primary Examiner*—Michael V Datskovskiy
(74) *Attorney, Agent, or Firm*—Harrington & Smith, PC (57) ABSTRACT

A hand-held portable electronic device frame assembly including a heat spreader made from a thermally conductive material; and an overmolded frame member which has been overmolded onto the heat spreader. The overmolded frame member includes a molded polymer material which forms a thermal insulator on the heat spreader. The frame member is adapted to structurally support at least one component of a hand-held portable electronic device thereon.

22 Claims, 7 Drawing Sheets

FIG.11

HAND-HELD PORTABLE ELECTRONIC DEVICE HAVING A HEAT SPREADER

BACKGROUND OF THE INVENTION

1. Field of the Invention

The invention relates to heat transfer and, more particularly, to heat transfer in a hand-held portable electronic device.

2. Brief Description of Prior Developments

Heat spreader elements are known which have been used for transferring heat from hot components. Materials such as copper, aluminum, silicon or graphite foil have been used for example. It is known to use a heat spreader encapsulated by using conventional thermoset (e.g. epoxy material).

A conventional method of cooling of a mobile device is based on use of a thermally high conductive printed wiring board (PWB). Heat is conducted from the integrated circuits (ICs) to the PWB; which is capable to spread the heat to the whole PWB area and, furthermore, to mechanics. High thermal conductivity of the PWB is achieved with using large, constant, and thick power and ground (GND) layers made of copper. This has been a sufficient method for cooling the low power devices so far. However, new technologies set totally new environment and requirements for cooling of mobile devices.

In mobile electronics, constantly increasing miniaturization with simultaneous increased need for higher power levels make thermal management of the device demanding due to the maximum temperatures for device surfaces and components. Efficient thermal management is one the elements enabling product functionality and increasing reliability. By enhancing cooling, higher power levels can be applied enabling added functionalities and performance. From a thermal point of view, there are a variety of cooling options to follow starting from chip level and package structural design to system level thermal management optimization. However, if focusing in conventional cooling solutions based on materials or cooling devices, they must be more and more integrated in the current mechanics due to miniaturization requirements.

In mechanics, most of the covers and chassis of mobile devices are currently made of thermoplastics using injection-molding technology. Thermoplastics, as such, are thermal insulators with their very low value of thermal conductivity. In practice, this prevents heat spreading in the mechanics causing localized high temperatures "hot spots".

U.S. patent application Ser. No. 11/157,719, which is hereby incorporated by reference in its entirety, discloses one type of heat transfer system used in a mobile telephone. There is a desire to provide a new type of system for mobile devices, such as hand-held portable electronic devices, which have a different type of heat spreader system, and a method of manufacturing.

SUMMARY OF THE INVENTION

In accordance with one aspect of the invention, a hand-held portable electronic device frame assembly is provided including a heat spreader made from a thermally conductive material; and an overmolded frame member which has been overmolded onto the heat spreader. The overmolded frame member includes a molded polymer material which forms a thermal insulator on the heat spreader. The frame member is adapted to structurally support at least one component of a hand-held portable electronic device thereon.

In accordance with another aspect of the invention, a hand-held portable electronic device frame assembly is provided comprising a heat spreader comprising a graphite foil section which is generally anisotropic; and a frame member connected with the heat spreader. The frame member provides structural support for the heat spreader. The frame member is adapted to form a structural support member of a hand-held portable electronic device.

In accordance with another aspect of the invention, a method for manufacturing a hand-held portable electronic device frame assembly is provided comprising placing a heat spreader in an injection molding device; and overmolding a frame member onto the heat spreader in the injection molding device, wherein the frame member provides thermal insulation to portions of the heat spreader. The frame member is formed with connection areas for connecting other components of a hand-held portable electronic device to the frame member for the frame member to form a structural support member of the hand-held portable electronic device.

BRIEF DESCRIPTION OF THE DRAWINGS

The foregoing aspects and other features of the invention are explained in the following description, taken in connection with the accompanying drawings, wherein.

DETAILED DESCRIPTION OF THE PREFERRED EMBODIMENTS

Figure 1:
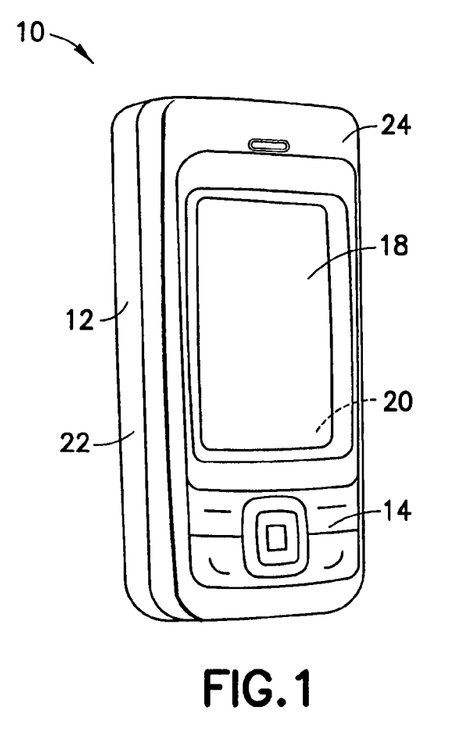
FIG. 1 is a perspective view of a mobile telephone incorporating features of the invention.

Referring to FIG. 1, there is shown a front view of a hand-held portable electronic device 10 incorporating features of the invention. Although the invention will be described with reference to the exemplary embodiments shown in the drawings, it should be understood that the invention can be embodied in many alternate forms of embodiments. In addition, any suitable size, shape or type of elements or materials could be used.

In this embodiment the device 10 is a mobile telephone. However, features of the invention can be used in other types of hand-held portable electronic devices, such as a PDA, a digital camera, a gaming device, etc. The phone 10 generally comprises a housing 12, a user interface 14 including a keypad 16 (see FIG. 2) and a display 18, and electronic circuitry 20. The phone 10 is a slide-type phone. However, features of the invention could be used in any suitable type of mobile phone including a block-type phone or a flip-type phone for example.

Figure 2:
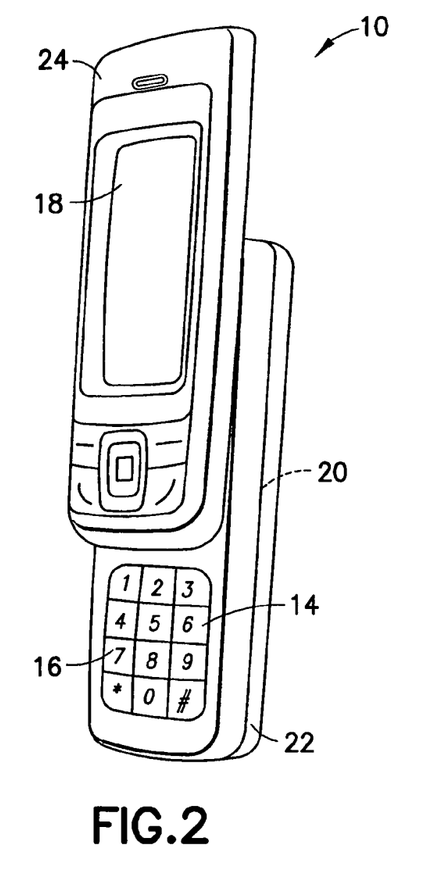
FIG. 2 is a perspective view of the telephone shown in FIG. 1 in an open, extended position.

FIG. 1 shows the phone 10 in a closed or non-extended position. FIG. 2 shows the phone 10 in an extended position. The phone 10 has a first section 22 which is slidably mounted on a second section 24 between the two positions shown in FIGS. 1 and 2.

Figure 3:
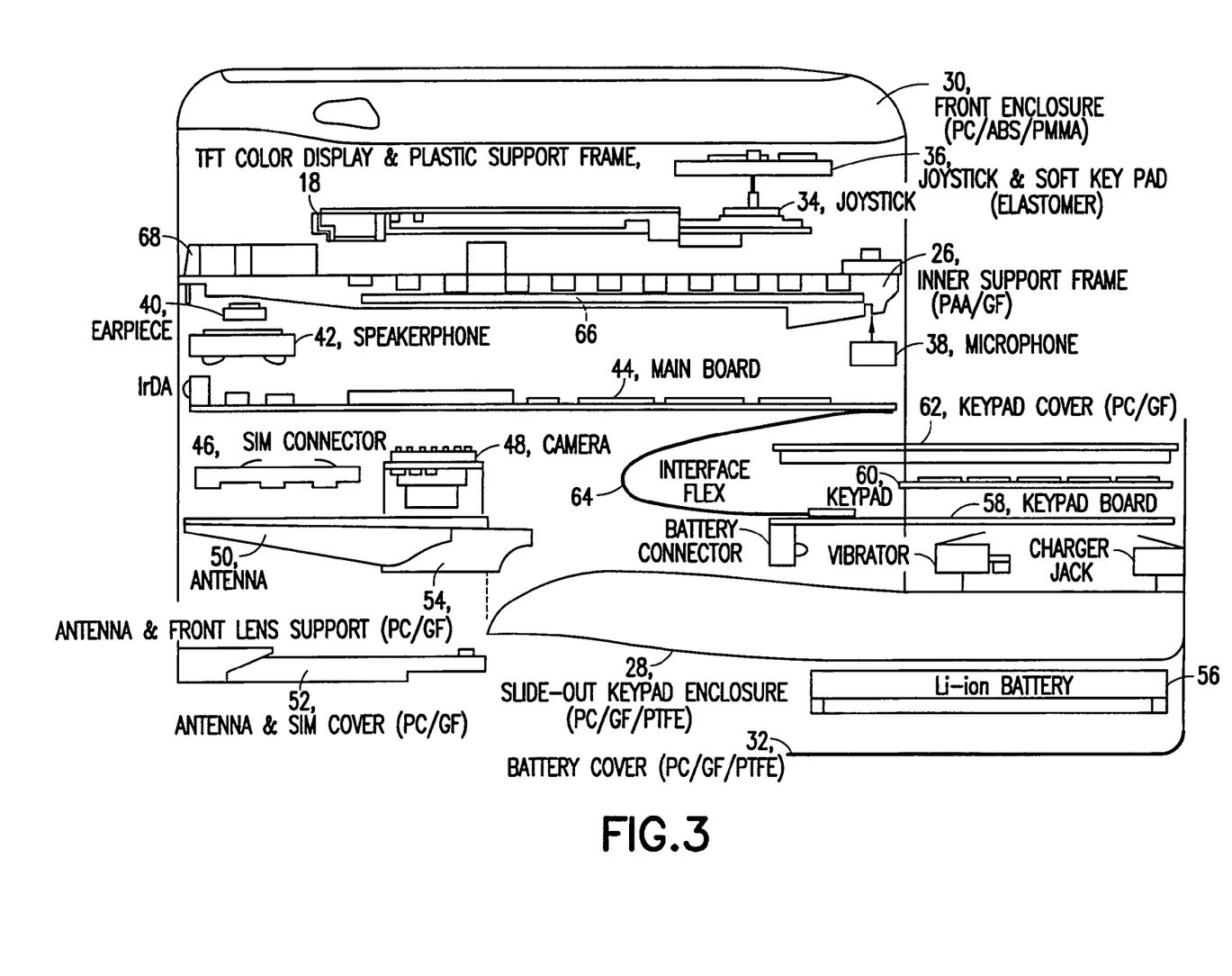
FIG. 3 is an exploded view of the telephone shown in FIG. 1.

Referring also to FIG. 3, the housing or frame 12 generally comprises an inner support frame 26, a first section housing member 28, a second section housing member 30 and a battery cover 32. The housing could comprise more or less members. The first section housing member 28, the second section housing member 30 and the battery cover 32 form exterior housing components of the device 10 which are directly contacted by the user's hand(s). The second section housing member 30 forms a front cover for the telephone 10 and might be user replaceable.

The second section housing member 30 is stationarily attached to the inner support frame 26. The display 18, display support frame, joystick 34, and joystick and soft key pad 36 are attached to the inner support frame 26, and are located between the inner support frame 26 and the cover 30. The microphone 38, earpiece 40, speakerphone 42 and main printed wiring board (PWB) 44 are attached to the inner support frame 26 at an opposite side. The second section 30 also includes a SIM card connector 46, a camera 48, an antenna 50 and an antenna and SIM card cover 52 connected to a support frame 54, which is mounted to the PWB 44. The PWB 44 has suitable electronics such as a microprocessor, a memory, a transceiver, etc. The first section 22 generally comprises the first section housing member 28, the battery cover 32, a rechargeable battery 56, a keypad printed wiring board 58, a keypad 60 and a keypad cover 62. The board 58 is connected to the board 44 by a flexible circuit 64. In alternate embodiments, other configurations could be provided.

As seen in FIG. 3, the inner support frame 26 is an assembly which comprises a heat spreader 66 and a frame member 68. The heat spreader 66 is comprised of thermally conductive material. The frame member 68 is comprised of molded plastic or polymer material. In a preferred embodiment, the frame member 68 is an overmolded frame member which has been overmolded onto the heat spreader 66. However, in an alternate embodiment the heat spreader 66 could be inserted into the frame member 68, or attached onto the frame member 68 such as by adhesive for example or sprayed onto the frame member 68, such as by metallization.

In a preferred embodiment the heat spreader 66 is a graphite member, such as a graphite foil for example. However, in an alternate embodiment the heat spreader could be a metal member, such as sheet metal or a metal foil. In addition to the inner support frame 26 having a heat spreader, one or more of the other frame members could alternatively or additionally have an integral heat spreader, such as the cover 30, the first housing section 28, the battery cover 32, the cover 52, and/or the support 54.

The invention can use a graphite or metal member as a heat spreader which has been embedded in a polymer structure (such as the inner support frame 26), and can provide a new manufacturing method for such a structure. The invention presents a novel concept and manufacturing method for integrating of extremely high thermally conductive graphite or metal heat spreader into the cover or chassis of a mobile device. Embedding of the thin heat spreader element with thermoplastic enables injection molding of complex 3D-shapes. This can also protect the heat spreader; especially graphite foil against wear. The polymer structure 68 can also provide a thermal insulator around the heat spreader 66 for controlled heat spreading inside the assembled hand-held portable electronic device cover or chassis.

A graphite member or metal member heat spreader element can be integrated into the cover or chassis by using the element as an insert in an injection molding process and over-mold the element with thermoplastics. A thin and flexible heat spreader foil can be also pre-fixed onto a 3D-shaped metal or thermoplastic pre-mold frame or carrier. This could protect the structurally weak heat spreader against pressure in the injection molding process; especially for a graphite foil. This approach of using a plastic or metal insert as a carrier for the heat spreader enables over-molding using conductive plastics; which would otherwise probably be too brittle to use in a mobile device.

Once the housing or frame is created with its integral heat spreader, such as frame 26 or housing members 28, 30, the frame is able to perform multiple functions. The frame can function both as a heat spreader and as a structural frame for attaching other components to or allowing the user to grasp the device 10 (such as when the heat spreader is in the housing members 28, 30).

Graphite foils are available as sheet format with different thickness, typically 100-1000 μm. Different coating options are also possible varying from adhesives to polyimide (dielectric) layers. Also pre-cut forms are typically available. Graphite or metal heat spreaders can be used as an insert in an over-molding process. However, for a graphite foil probably the most convenient manufacturing method is to pre-fix it onto a metal or plastic support frame (pre-mold carrier) before the over-molding process. This approach can support the thin foil against injection pressure, and makes it easier to have 3D-shapes with flexible graphite foil.

Figure 4:
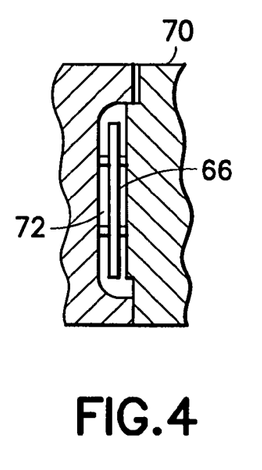
FIG. 4 is a cross sectional view of an injection molding tool for forming the inner support frame.

Referring also to FIG. 4, a heat spreader 66 can form an insert which can be encapsulated with plastics by using conventional injection molding machinery and tool 70 and injecting the plastic into a cavity 72 of the mold. The insert 66 can be mechanically locked inside the frame member formed in the cavity 72 by over-molding the insert 66 with plastic. This approach gives the most freedom for selection of the materials.

On the other hand, if an additional carrier is used, the plastic of a heat spreader carrier can also adhered with the over-molded plastic. If the carrier is metal, the metal used as the carrier can be, for example, polymer coated that can enable the adhesion between the insert and over-molded plastic. The overmolded thermoplastic could also be thermally conductive. This could increase possibilities to design thermal management inside the mobile device. A metal or thermoplastic carrier can eliminates problems of poor mechanical properties of thermally conductive composites.

Over-molding (also known as insert molding) is known to produce precise and complex-shaped plastic parts in mass production for mobile devices. Modern manipulators, robots and automation technology for assembly make it possible to handle the pre-assembly of graphite inserts if needed and feed them into the injection-molding tool.

Graphite foil has anisotropic thermal conductivity. This means that it has extremely high in-plane thermal conductivity while relatively low through-plane thermal conductivity. Thus, it perfectly fits for spreading the heat for wide areas. By adding such a heat spreader inside the plastic mechanics, a heat path can be designed also so that heat is spread in a controlled manner for specific areas while protecting heat conduction through in other specific areas.

Heat can be conducted into the graphite foil or metal heat spreader from the modules or components by using compressible thermal interface materials as conductive media for example. Plastic mechanics, while having lower temperature, can act as a sufficient heat sink.

Figure 5:
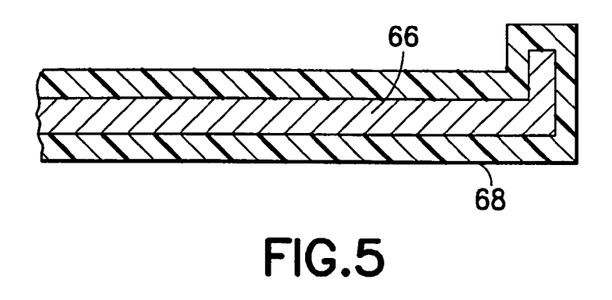
FIG. 5 is an enlarged cross sectional view of a portion of the inner support frame shown in FIG. 3.
Figure 6:
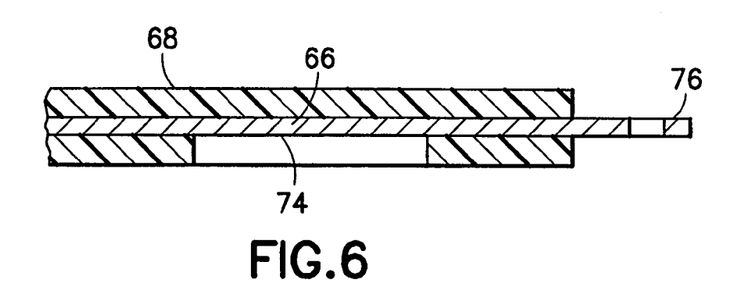
FIG. 6 is an enlarged cross sectional view of another portion of the inner support frame shown in FIG. 3.
Figure 7:
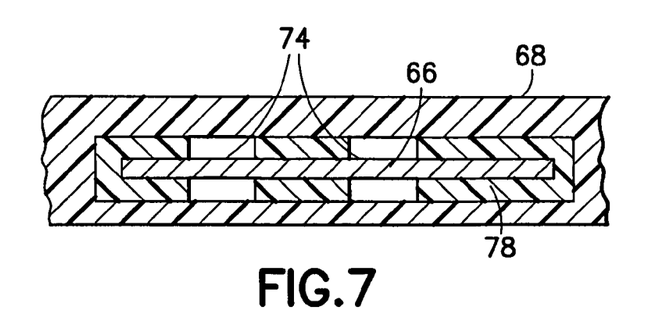
FIG. 7 is an enlarged cross sectional view of a portion of an alternate embodiment of the inner support frame shown in FIG. 3.

Referring also to FIG. 5, one of the features of the invention is the ability to have a three dimensional (3-D) shaped heat spreader 66. The heat spreader does not need to be flat. Likewise, the frame 68 can have a three dimensional shape and does not need to be flat. Referring also to FIG. 6, portions of the heat spreader 66 could be blocked during the over-molding process to form open areas 74 and thermal connections areas 76 for thermal connection to other members. As seen in FIG. 7, when used with a carrier 78, the overmolded frame member 68 can be overmolded onto both the carrier 78 and the heat spreader 66, and the heat spreader could also have open areas 74.

Figure 8:
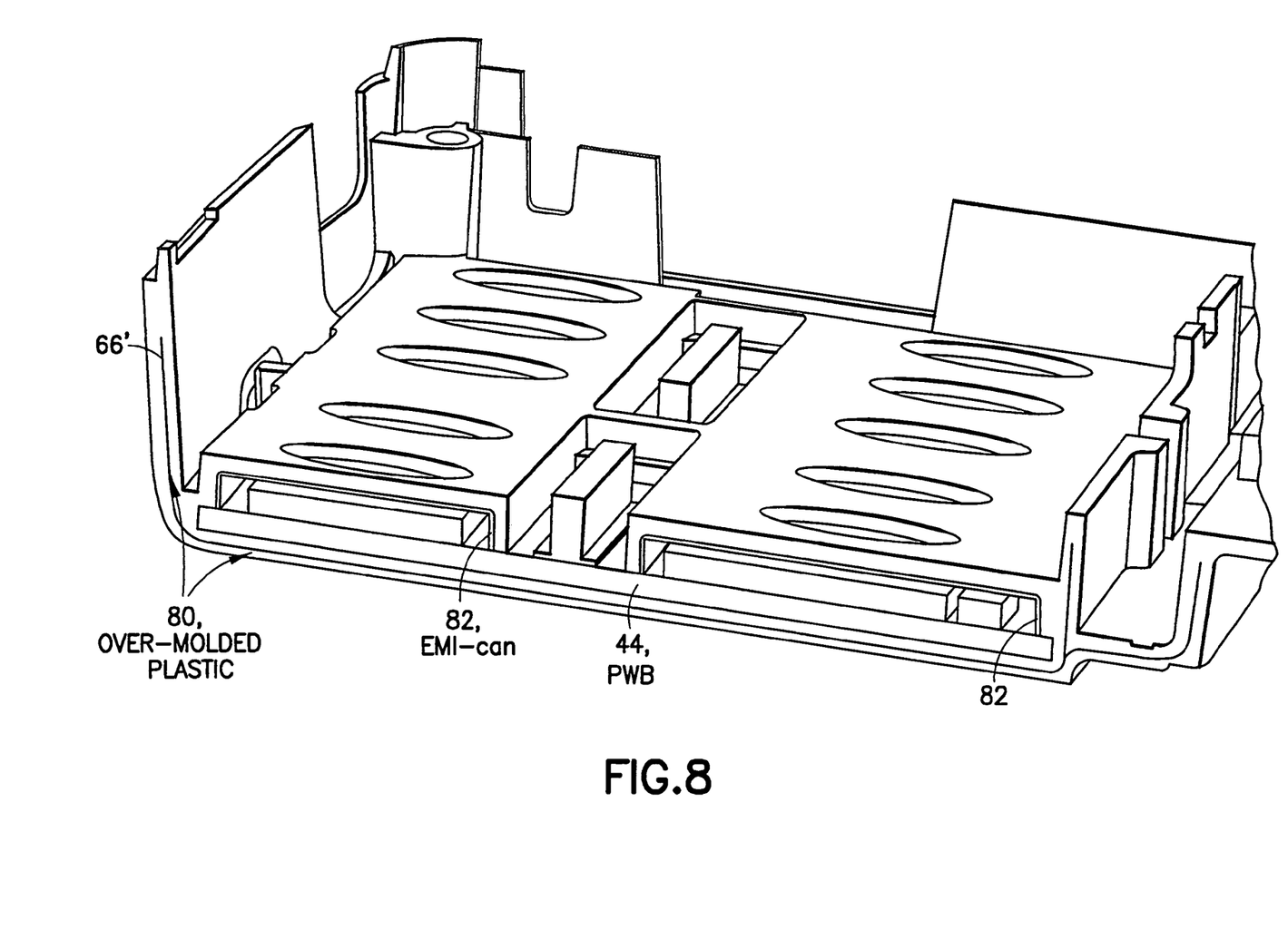
FIG. 8 is a perspective view of an alternate embodiment of the invention with a cut away section.
Figure 12:
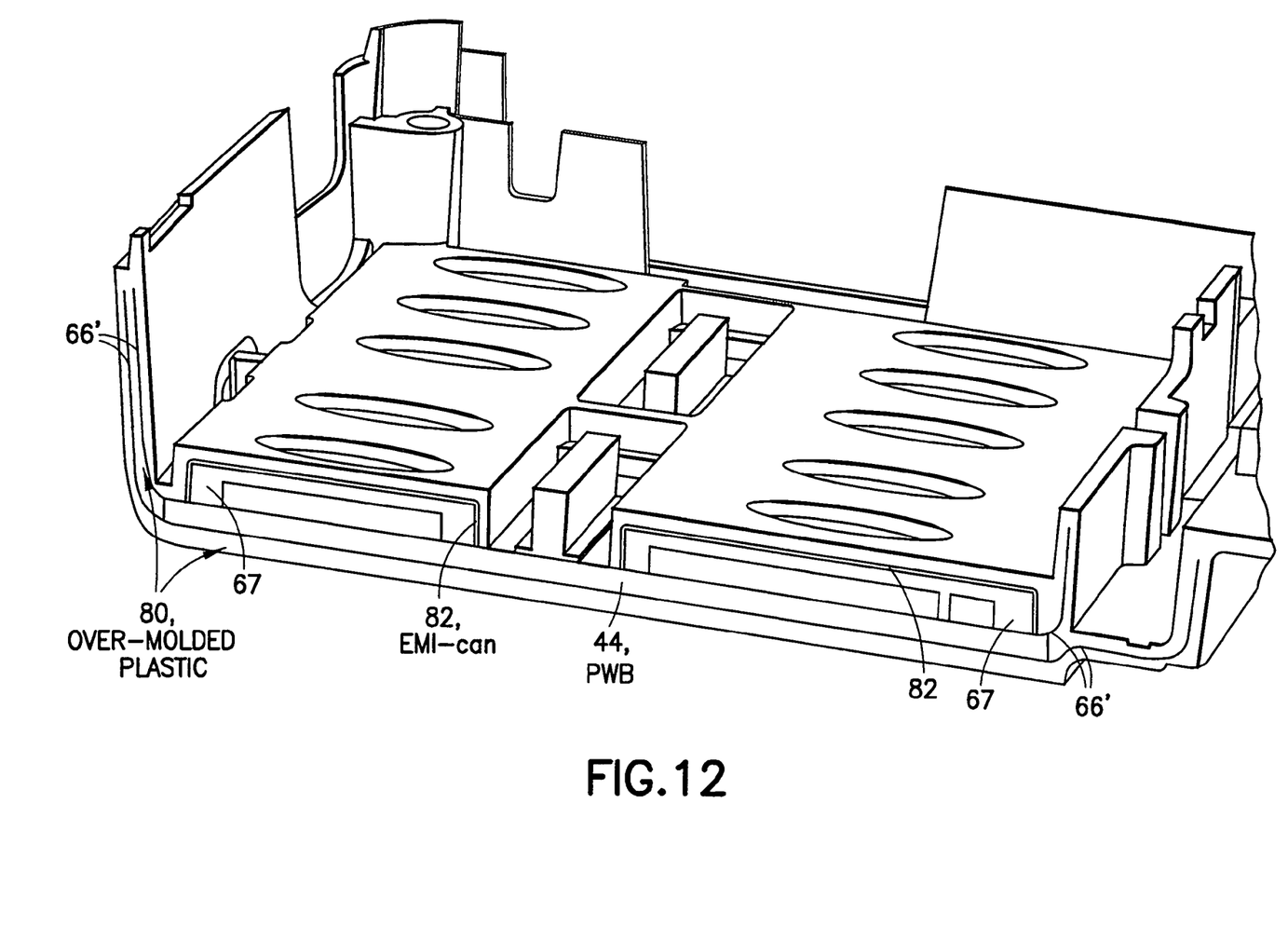
FIG. 12 is a perspective view of an alternate embodiment of the invention with a cut away section similar to FIG. 8, but showing that the heat spreader can be on both sides of the printed wiring board.

Referring also to FIG. 8, in an alternate embodiment the overmolded frame member 80 could be overmolded onto the PWB 44, and onto EMI cans 82 (which form heat spreaders), and onto non-packed electronic components, and perhaps also onto an additional graphite foil heat spreader 66. The EMI-can is preferably filled with thermally conductive material before overmolding. The frame member 80 is molded with structural attributes to allow it to be connected to at least one other housing frame member and also to other electronic components of the portable electronic device. FIG. 12 shows another alternate embodiment similar to FIG. 8. However, in this embodiment the heat spreader 66' is provided on both the top and bottom sides of the PWB 44. In addition, thermally conductive material 67 is provided inside the EMI-can 82 before overmolding occurs. The combination of materials and EMI-can shield can improve the structural integrity of the overall device and, therefore, the outer mechanics do not need to be as strong. This can lend itself to an overall thinner product. At present, mobile phones tend to have a relatively strong exoskeleton. This invention moves towards a strong endoskeleton.

Advantages of the invention include a graphite foil heat spreader which can improve thermal management of the system enabling use of higher power levels in more miniaturized future devices. With experiments it has been successfully demonstrated that a significant decrease in component temperatures (product dependent) can be obtained by using a graphite foil glued on normal polyphenylene sulfide (PPS) chassis with thermal interface materials.

Figure 9:
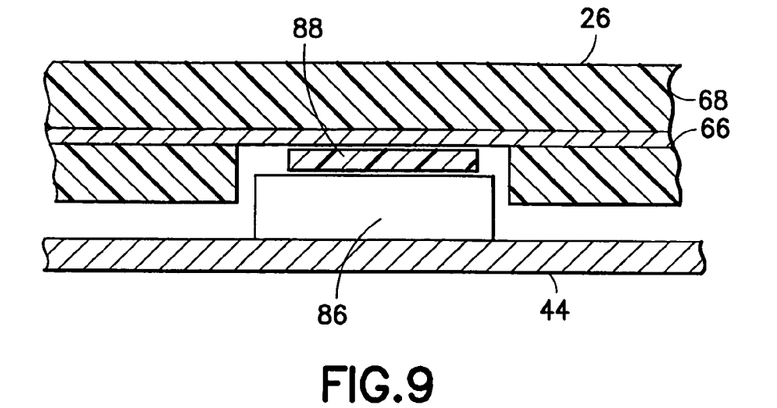
FIG. 9 is a partial cross sectional view of components of the phone shown in FIG. 3 showing a thermal connection.

Referring also to FIG. 9, one embodiment of a connection of the heat spreader 66 to a heat generating electronic component 86 on the PWB 44 is shown. In this embodiment a thermal junction between the component 86 and the heat spreader 66 is provided by a compressible thermal interface material 88. However, in alternate embodiments any suitable type of thermal junction or interface could be provided including an air interface.

Graphite foil having anisotropic thermal conductivity (tailorable) spreads heat extremely well in an in-plane direction (k X.Y.=300-1500 W/mK) while relatively low through-plane thermal conductivity (k Z=10 W/mK) act as an insulator shield across the structure. Typical metals have isotropic thermal conductivity values of 20 W/mk (stainless steel), 200 W/mK (aluminum), 390 W/mK (copper), and plastics 0.3 W/mK (normal), 5 W/mK (thermally advanced plastics), respectively.

Figure 10:
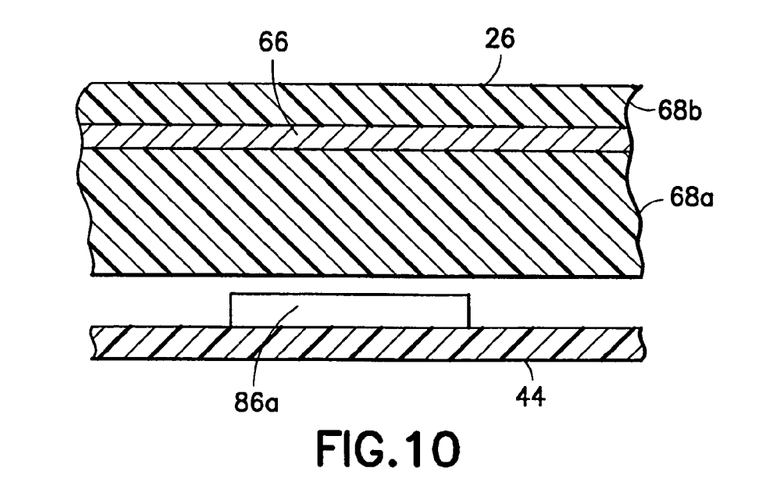
FIG. 10 is a partial cross sectional view of components of the phone shown in FIG. 3 showing a thermal insulation area.
Figure 11:
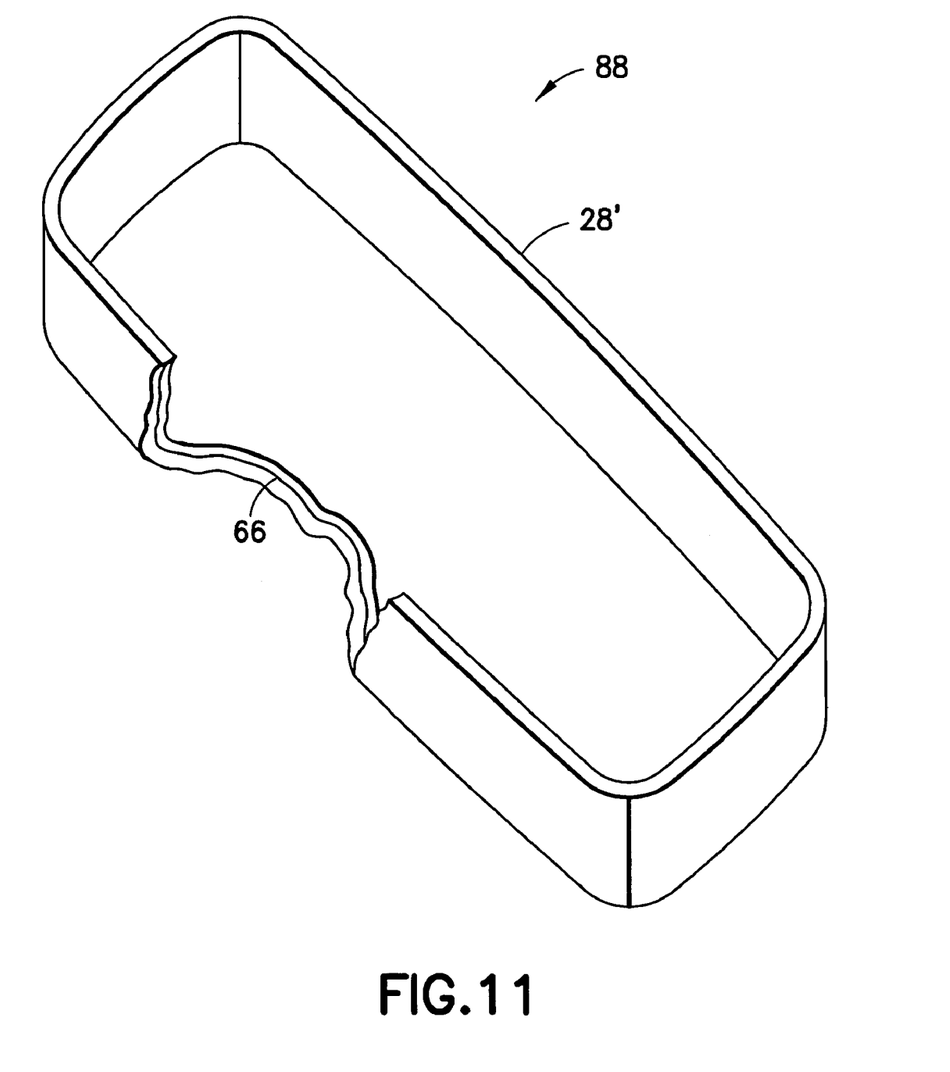
FIG. 11 is a perspective view of an alternate embodiment of a phone housing member assembly with a cut away section.

Referring also to FIG. 10, the frame member 68 can have different areas with different thicknesses. In this embodiment, the area 68a is thicker than the area 68b. Because the area 68a has a greater thickness, the material of the frame member 68 at the area 68a can help to insulate the component 86a on the PWB 44 from heat in the heat spreader 66. The heat in the heat spreader 66 transfers through the area 68b faster than through the area 68a. Referring also to FIG. 11, an exterior housing 88 member of a portable telephone is shown having an integral graphite foil heat spreader 66 and an overmolded frame member 28'. The graphite foil heat spreader 66 extends along a majority of the length and width of the frame member 28'; along most of the cross section of the frame member 28'. As noted above, because the graphite foil heat spreader 66 has anisotropic thermal conductivity, heat is quickly transferred along the entire heat spreader 66, but relatively slowly passes through the frame member 28'. Thus, the enlarged and distributed area of the heat release, and the slowed down release of the heat, allows the invention to be in a frame member which is contacted by a user, such as the user's hand or ear or face, without the user feeling uncomfortable heat. In a preferred embodiment, substantially the entire heat spreader is encased by the overmolded frame member except at the thermal connection areas to heat generating electronic components of the hand-held portable electronic device. However, in alternate embodiments, areas of the heat spreader might not be covered by the frame member to allow accelerated heat transfer to surrounding air at those location(s); analogous to heat fins. However, in such an alternate embodiment, at least a majority of the heat spreader is encased by the overmolded frame member except at the thermal connection areas to heat generating electronic components of the hand-held portable electronic device.

As noted above, the invention can be incorporated into the first section housing member 28 and/or the second section housing member 30 and/or the battery cover 32. These all form exterior housing components of the device 10 which are directly contacted by the user's hand(s). Even thought the heat spreader in overmolded into the frame member, the heat transfer is spread out and not excessive to become uncomfortable for the user. This can be increasingly important for very small hand held devices where internal heat generation might become a problem if not spread out quickly. By incorporation the heat spreader in the frame member(s), this can be done efficiently and without increasing the size of the overall device.

The invention combines the design freedom of thermoplastic and mass production capability with extremely conductivity of graphite foil. Thin and strong structures are possible. A metal carrier for a graphite member could also be utilized as EMI-shielding or an antenna. Thermoplastic can also be conductive. Insert molding streamlines the manufacturing process by eliminating post-assembly processes. A graphite foil heat spreader is an excellent anisotropic heat conductor. This invention describes the benefits of embedding graphite foil inside the polymer structure and a manufacturing method for such integrated structure.

The invention can comprise utilizing an extremely efficient heat spreader of very thin graphite foil. Conductivity can be provided on substantially only a horizontal (in-plane) plane. Over-molding the element inside thermally insulate plastic can protect sensitive components or mobile surface for hot spot during heat spreading. A heat spreader integrated into device mechanics can be provided. Over-molding with plastic enables designing of 3D-shapes (e.g., a cover). This can help provide product miniaturization.

The invention can enable controlled heat transferring inside cover mechanics of a portable hand-held electronic device, such as a mobile telephone or gaming device. The invention enables transfer of heat inside the cover if electronic components have been over-molded (integrated into the mechanics). The invention can be provided as a mobile device thermal solution at system level mechanics; not at IC packaging.

The invention can comprise utilizing of extremely efficient heat spreading of very thin graphite foil (~100 microns). Thermal conductivity of the graphite foil is highly anisotropic, meaning very high thermal conductivities in-plane, low thermal conductivities in through-plane. This feature can be utilized for i) heat spreading in-plane and ii) heat shielding in through-plane in the plastic mechanics parts. Metals are isotropic, thus this thermal feature is not possible with using metals. However, this manufacturing method is capable for utilizing metallic heat spreaders also and can be used for those as well where applicable.

Graphite foil embedded in plastic structure enables complex 3D shapes for the part still maintaining its heat transfer capability. This is not possible with any surface attachment methods, like using adhesives, laminations, etc. A heat spreader integrated into thin device plastic mechanics during the injection molding process enables ultra thin, miniaturized mechanics with having the heat transfer solution integrated in fast manufacturing process. Thermal management of the mobile device is becoming more critical and challenging in the near future while the power densities are constantly increasing with simultaneous mechanics miniaturization. This invention provides a novel solution in this area.

The invention can combine both the undeniable benefits of the injection molding technology in mass production, and design freedom of thermoplastics, with extremely high thermally conductivity of graphite foil or/and sheet metal in manufacturing of slim covers of future high power mobile devices. The heat can be transferred efficiently and controllable inside a thermally non-conductive thermoplastic casing.

Thermoplastics can be made thermally conductive by adding conductive fillers or additives up to 70 percent by weight. However, after this both mechanical properties and process ability of these composite materials decrease significantly. On the other hand, at its best conductivity level, thermally conductive thermoplastic composites are much lower compared to that of metals or pure graphite.

Laws of physics (Newton's Law of Cooling) set the limits for cooling capability for a device with given dimensions, power, maximum allowed temperatures for a part to be cooled, and ambient temperature (cooling media). In portable electronics, the limiting temperatures are the maximum component temperatures, maximum surface temperatures, and ambient temperatures.

By increasing hot surface area, more power can be cooled with keeping the other boundary conditions constant. This is possible by enhancing the heat spreading in the material to be cooled. Increasing heat spreading is one of the easiest ways of thermal management. Heat can spread to wider area and, thus, lower the component temperatures and make surfaces more isothermal. This enables more efficient natural convection or conduction from the surface. It's also passive cooling method meaning additional active cooling devices are not needed.

A graphite foil or metal heat spreader can be fixed afterwards onto a thermoplastic cover or chassis by using adhesives, gluing, stacking or welding post-assembly operations. This multi-step approach produces structures in which a graphite foil or metal heat spreader will remain on the surface. However, this increases risks for wearing or failure in use; especially for a bare graphite surface. Moreover, this manufacturing approach limits possibilities to utilize a novel concept for transferring heat efficiently and controllable inside the thermally non-conductive plastic mechanics.

The invention overcomes above-mentioned trade-offs and reduces thermal problem inside the mobile device.

It should be understood that the foregoing description is only illustrative of the invention. Various alternatives and modifications can be devised by those skilled in the art without departing from the invention. Accordingly, the invention is intended to embrace all such alternatives, modifications and variances which fall within the scope of the appended claims.

What is claimed is:

1. An apparatus comprising:
   a heat spreader comprising thermally conductive graphite material;
   a carrier having the heat spreader attached thereto; and
   an overmolded frame member which has been overmolded onto the heat spreader and the carrier, wherein the overmolded frame member comprises a molded polymer material which forms a thermal insulator on the heat spreader, and wherein the frame member is adapted to structurally support at least one component of a hand-held portable electronic device thereon.

2. An apparatus as in claim 1 wherein the frame member is adapted to form an exterior housing member of the hand-held portable electronic device.

3. An apparatus as in claim 2 wherein the frame member is adapted to form a mobile telephone exterior housing member.

4. An apparatus as in claim 1 wherein the frame member is adapted to form a printed wiring board support of the hand-held portable electronic device.

5. An apparatus as in claim 1 wherein the heat spreader comprises a graphite foil.

6. An apparatus as in claim 1 wherein the heat spreader comprises a metal member.

7. An apparatus as in claim 1 wherein the heat spreader comprises a brittle conductive plastic material.

8. An apparatus as in claim 1 wherein the carrier at least partially forms a structural support for the heat spreader, wherein the heat spreader is structurally rigidly supported on the carrier.

9. An apparatus as in claim 1 wherein the heat spreader comprises at least one non-flat section to form a three-dimensional shape.

10. An apparatus as in claim 1 wherein the frame member comprises at least one non-flat section to form a three-dimensional shape.

11. A hand-held portable electronic device comprising:
   a frame comprising an apparatus as in claim 1; and
   electronic components located inside the frame, wherein a first one of the electronic components is thermally connected to the heat spreader by a junction comprising thermally conductive material.

12. A hand-held portable electronic device as in claim 11 wherein the junction is compressible.

13. A mobile telephone comprising:
   an apparatus as in claim 1; and
   at least one mobile telephone electronic component connected to the apparatus.

14. An apparatus comprising:
   a heat spreader comprising a graphite foil section which is generally anisotropic;
   a pre-mold carrier having the graphite foil section structurally supported thereon; and a frame member connected with the heat spreader and the pre-mold carrier, wherein the frame member is adapted to form a structural support member of a hand-held portable electronic device, and wherein the frame member is an overmolded polymer material which has been overmolded onto the graphite foil section.

15. An apparatus as in claim 14 wherein the frame member is adapted to form an exterior housing member of the hand-held portable electronic device.

16. An apparatus as in claim 15 wherein the frame member is adapted to form a mobile telephone exterior housing member.

17. An apparatus as in claim 14 wherein the frame member is adapted to form a printed wiring board support of the hand-held portable electronic device.

18. An apparatus comprising:
  a heat spreader comprising thermally conductive graphite material;
  a pre-mold carrier having the heat spreader directly attached thereto;
  an overmolded frame member which has been overmolded onto the heat spreader and the pre-mold carrier, wherein the overmolded frame member comprises a molded polymer material which forms a thermal insulator on the heat spreader, and wherein the frame member is adapted to structurally support at least one component of a hand-held portable electronic device thereon; and
  means for providing a thermal connection between the heat spreader in the frame member and a heat generating electronic component of a hand-held portable electronic device which the apparatus is subsequently assembled into, wherein the heat spreader is adapted to spread heat from the heat generating electronic component through the frame member.

19. A method for manufacturing a hand-held portable electronic device frame assembly comprising:
  forming an assembly comprising attaching a graphite foil heat spreader to a structural pre-mold carrier;
  placing the assembly in an injection molding tool; and
  overmolding a frame member onto the assembly in the injection molding tool, wherein the frame member provides thermal insulation to portions of the heat spreader, and wherein the frame member is formed with connection areas for connecting other components of a hand-held portable electronic device to the frame member for the frame member to form a structural support member of the hand-held portable electronic device.

20. An apparatus as in claim 1 wherein the molded polymer material of the overmolded frame member comprises an electrically conductive plastic material.

21. An apparatus as in claim 14 wherein the overmolded polymer material of the frame member comprises an electrically conductive plastic material.

22. An apparatus as in claim 18 wherein the molded polymer material of the overmolded frame member comprises an electrically conductive plastic material.

* * * * *